United States Patent
Gao

(10) Patent No.: US 10,483,910 B2
(45) Date of Patent: Nov. 19, 2019

(54) MULTIPORT INDUCTORS FOR ENHANCED SIGNAL DISTRIBUTION

(71) Applicant: Credo Technology Group Limited, Grand Cayman (KY)

(72) Inventor: Xiang Gao, Fremont, CA (US)

(73) Assignee: Credo Technology Group Limited, Grand Cayman (KY)

( * ) Notice: Subject to any disclaimer, the term of this patent is extended or adjusted under 35 U.S.C. 154(b) by 166 days.

(21) Appl. No.: 15/423,398

(22) Filed: Feb. 2, 2017

(65) Prior Publication Data

US 2018/0219513 A1   Aug. 2, 2018

(51) Int. Cl.
| | | |
|---|---|---|
| *H03B 5/12* | (2006.01) | |
| *H01L 49/02* | (2006.01) | |
| *H01F 5/00* | (2006.01) | |
| *H01F 17/00* | (2006.01) | |
| *H01F 5/04* | (2006.01) | |

(52) U.S. Cl.
CPC ........... *H03B 5/1215* (2013.01); *H01F 5/003* (2013.01); *H01F 17/0006* (2013.01); *H01L 28/10* (2013.01); *H03B 5/1228* (2013.01); *H01F 2005/043* (2013.01)

(58) Field of Classification Search
CPC . H03B 5/08; H03B 5/12; H03B 12/06; H03B 12/1212; H03B 5/1215; H03B 5/1231; H01F 5/003; H01F 2005/043; H01F 5/04; H01F 17/0006; H01F 2021/125; H01F 27/2804; H01F 27/2809; H01F 27/29
See application file for complete search history.

(56) References Cited

U.S. PATENT DOCUMENTS

| | | | |
|---|---|---|---|
| 4,686,488 A | 8/1987 | Attenborough | |
| 5,768,268 A | 6/1998 | Kline et al. | |
| 6,678,842 B1 | 1/2004 | Schaffer et al. | |
| 7,058,150 B2 | 6/2006 | Buchwald et al. | |
| 7,151,430 B2 | 12/2006 | Mattsson | |
| 7,629,859 B2 * | 12/2009 | Rai ...................... | H03B 5/1847 331/117 R |
| 8,183,971 B2 | 5/2012 | Le Guillou et al. | |

(Continued)

FOREIGN PATENT DOCUMENTS

| | | |
|---|---|---|
| CN | 104584152 A | 4/2015 |
| WO | 2013/149995 | 10/2013 |

OTHER PUBLICATIONS

International Search Report and Written Opinion dated Jan. 11, 2018, in PCT/CN17/79880.

(Continued)

*Primary Examiner* — Ryan Johnson
(74) *Attorney, Agent, or Firm* — Ramey & Schwaller, LLP

(57) ABSTRACT

Integrated circuits such as multi-channel transceivers may share oscillators having loop inductors. To minimize the driving distance from the shared oscillators to the transceiver modules, the loop inductor may be equipped with an additional sense port diametrically opposite to the drive port. An oscillator drive core may be coupled to the drive port to provide an oscillating signal at the drive and sense ports. The oscillating signals can be converted into digital clock signals by way of a differential amplifier. Three-loop inductor designs and/or multi-winding inductor designs may be preferred for minimizing parasitic effects of the added sense port.

20 Claims, 5 Drawing Sheets

(56) References Cited

U.S. PATENT DOCUMENTS

| | | |
|---|---|---|
| 8,841,983 B2 | 9/2014 | Newton |
| 9,177,709 B2 | 11/2015 | Parthasarathy et al. |
| 9,385,859 B2 | 7/2016 | Kuan et al. |
| 2007/0182502 A1* | 8/2007 | Shin .................... H03B 5/1228 331/167 |
| 2007/0246805 A1 | 10/2007 | Ligang et al. |
| 2008/0278250 A1* | 11/2008 | Hung .................. G06F 17/5063 331/117 R |
| 2012/0044034 A1 | 2/2012 | Nazarian et al. |
| 2015/0003505 A1 | 1/2015 | Lusted et al. |
| 2016/0337114 A1 | 11/2016 | Baden et al. |

OTHER PUBLICATIONS

Yang, Ching-Yuan; A High-Frequency CMOS Multi-Modulus Divider for PLL Frequency Synthesizers; Analog Integr Circ Sig Process; 2008; pp. 155-162; vol. 55; Springer Science+Business Media, LLC.

Non-Final Office Action dated Jan. 24, 2018, in U.S. Appl. No. 15/487,045.

International Search Report and Written Opinion dated May 9, 2017, in International Application No. PCT/CA16/91836.

U.S. Appl. No. 15/154,567, filed May 13, 2016, Xike Liu, Integrated Multi-Channel Receiver Having Independent Clock Recovery Modules With Enhanced Inductors.

"PCT International Search Report and Written Opinion", dated May 9, 2017, Appl No. PCT/CN2016/091836, "Enhanced Inductors Suitable for Integrated Multi-Channel Receivers," Filed Jul. 27, 2016, 13 pgs.

Notice of Allowance dated Mar. 8, 2019, in U.S. Appl. No. 15/702,715.

* cited by examiner

FIG. 5A
FIG. 5B
FIG. 5C
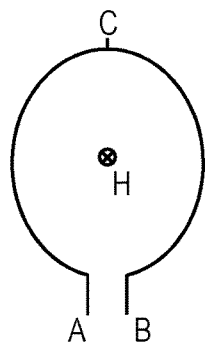
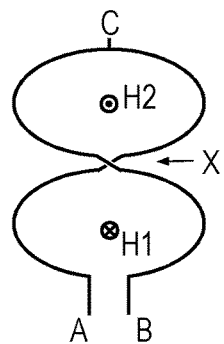
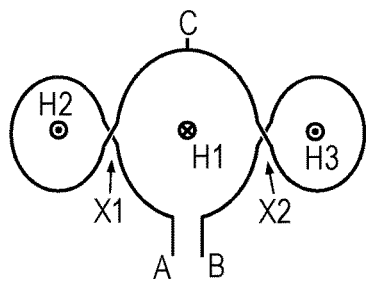
FIG. 6
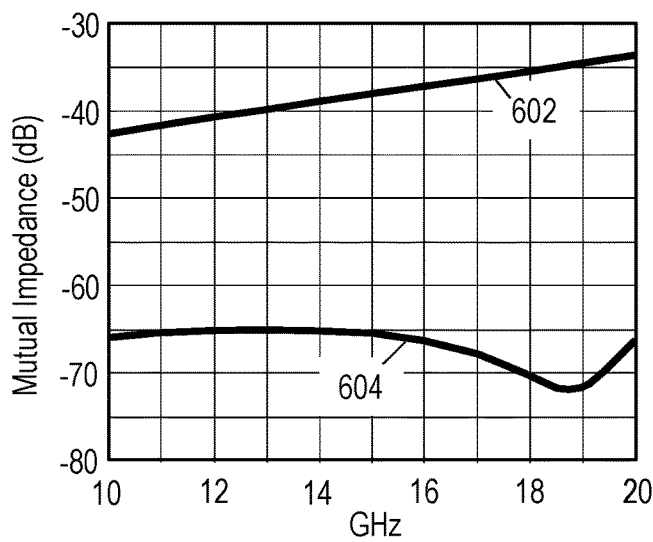

MULTIPORT INDUCTORS FOR ENHANCED SIGNAL DISTRIBUTION

BACKGROUND

Digital communications occur between sending and receiving devices over an intermediate communications medium, e.g., a fiberoptic cable or insulated copper wire, having one or more designated communications channels, e.g., carrier wavelengths or frequency bands. Each sending device typically transmits symbols at a fixed symbol rate, while each receiving device detects a (potentially corrupted) sequence of symbols and attempts to reconstruct the transmitted data.

A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by a sequence of two or more symbols. The simplest digital communication links use only one bit per symbol; a binary '0' is represented by one symbol (e.g., an electrical voltage or current signal within a first range), and binary '1' by another symbol (e.g., an electrical voltage or current signal within a second range). Channel non-idealities produce dispersion which may cause each symbol to perturb its neighboring symbols, causing intersymbol interference (ISI). As the symbol rate increases, ISI can make it difficult for the receiving device to determine which symbols were sent in each interval, particularly when such ISI is combined with additive noise.

As part of the process for recovering digital data from the degraded analog signal, receivers obtain discrete samples of the signal. The sample timing is often a critical part of the process, as it directly affects the signal to noise ratio possessed by the discrete samples. Strategies for detecting and tracking optimal sample times exist with varying degrees of tradeoff between simplicity and performance. In multi-channel environments, additional performance considerations must be taken into account when determining the optimal balance between simplicity and performance. Such performance considerations include timing jitter attributable to electromagnetic field interference with inductors in clock recovery modules.

SUMMARY

Accordingly, there are disclosed herein integrated circuits employing multiport inductors to facilitate sharing of clock signals. One illustrative integrated circuit embodiment includes: a substrate and a loop inductor. The inductor has a drive port on an outer perimeter of the inductor, and a sense port diametrically opposite to the drive port. The sense port is connected to taps on the outer perimeter of the inductor at a sufficient "electrical distance" from the inductor's center tap or electrical center.

Another illustrative electrical circuit embodiment includes: at least two circuit modules manufactured on a substrate and coupled to receive clocks derived from oscillating signals at different ports of an inductor in shared oscillator. An oscillator drive core is coupled to a drive port of the inductor to generate the oscillating signal on the drive port and a sense port.

An illustrative method embodiment includes: (a) providing an inductor having: one or more loops on a substrate; a drive port on an outer perimeter of the inductor; and a sense port connected to taps on the outer perimeter, the sense port positioned diametrically opposite the drive port; (b) coupling a drive core to the drive port to produce oscillating signals from the drive port and the sense port; (c) conveying a clock derived from the drive port's oscillating signal to a first circuit module on one side of the inductor; and (d) conveying a clock derived from the sense port's oscillating signal to a second circuit module on an opposite side of the inductor.

Each of the foregoing embodiments may be employed alone or in combination, together with any one or more of the following optional features in any suitable combination: (1) the drive port also serves as an output port. (2) an oscillator drive core coupled to the drive port to produce oscillating signals from the drive port and the sense port. (3) the oscillator drive core is configured to adjust a frequency of the oscillating signals in response to a control signal. (4) the inductor includes multiple windings for each loop. (5) the inductor further includes a crossover on the outer perimeter closest to the sense port. (6) the taps are connected on either side of the crossover. (7) the inductor is a single-winding inductor. (8) the inductor is a three-loop inductor. (9) each loop of the inductor defines a corresponding dipole. (10) the dipoles substantially cancel or sum to zero. (11) dipoles for the two side loops are equal and arranged symmetrically relative to a center loop dipole. (12) each tap connects to the outer perimeter of a side loop at a point closest to a terminal of the sense port. (13) each tap connects to the outer perimeter at a point closest to a terminal of the sense terminal subject to obtaining a sense port signal amplitude at least 50% of a drive port signal amplitude. (14) the first and second modules each include a communications transmitter or a communications receiver or both. (15) the first and second modules are positioned on opposite sides of the shared oscillator. (16) supplying a control signal to the drive core to adjust a frequency of the oscillating signals.

BRIEF DESCRIPTION OF THE DRAWINGS

In the drawings:

FIGS. 5A-5C show illustrative loop inductor configurations.

FIG. 6 is a graph comparing the coupling between different inductor configurations.

Figure 1:
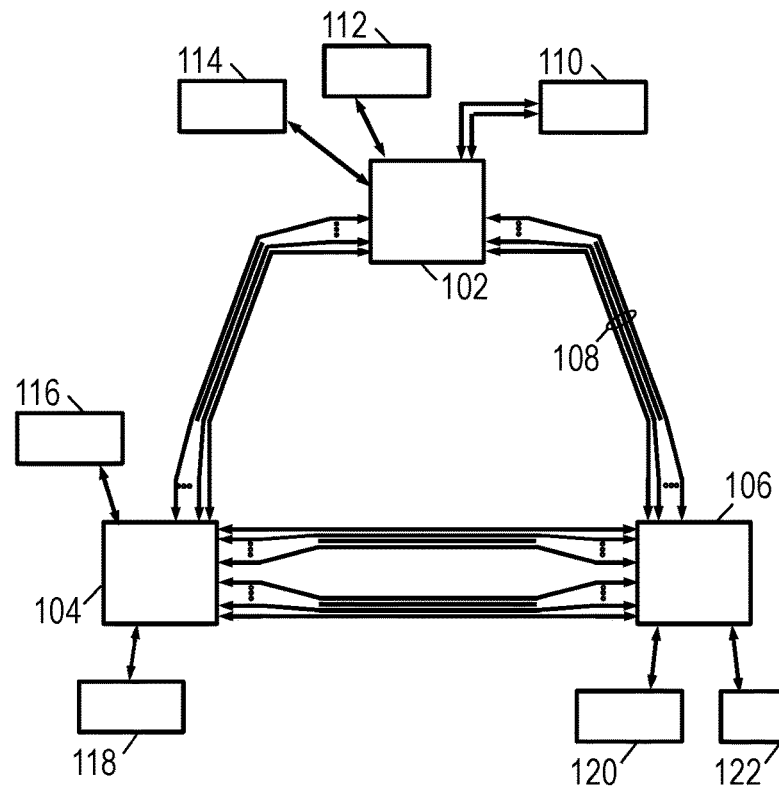
FIG. 1 shows an illustrative computer network.

It should be understood, however, that the specific embodiments given in the drawings and detailed description do not limit the disclosure. On the contrary, they provide the foundation for one of ordinary skill to discern the alternative forms, equivalents, and modifications that are encompassed in the scope of the appended claims.

DETAILED DESCRIPTION

The disclosed apparatus and methods are best understood in with reference to an illustrative context. Accordingly, FIG. 1 shows an illustrative communications network 100 having communications links 108 interconnecting nodes 102, 104, 106 (representing switches, routers, base stations, gateways, and other forms of communications equipment) that direct and relay communications signals between terminal nodes 110-122 (which may represent mobile devices, portable computers, workstations, servers, network-attached storage systems, and other such communications sources and destinations). The communications network 100 may be or include, for example, the Internet, a wide area network, or a local area network.

Communication links 108 may wired or wireless communication channels. As one example, the communication links may be fiberoptic cables having bundles of optical fibers each carrying multiple modulated light signals on corresponding channels. Many fiberoptic cables have multiple bundles of optical fibers, with each fiber carrying multiple channels. With such dense packing of information signals (which can also be found in other forms of wireless or wired communications links), highly integrated communications transceivers are advantageous for efficient interfacing with communications equipment. It is desirable to combine the integrated circuits for multiple transmitter modules and multiple receiver modules on a shared monolithic semiconductor substrate, such as a segmented die of a silicon wafer. Such an environment presents potential issues of interference between the various transmitter or receiver modules.

Figure 2:
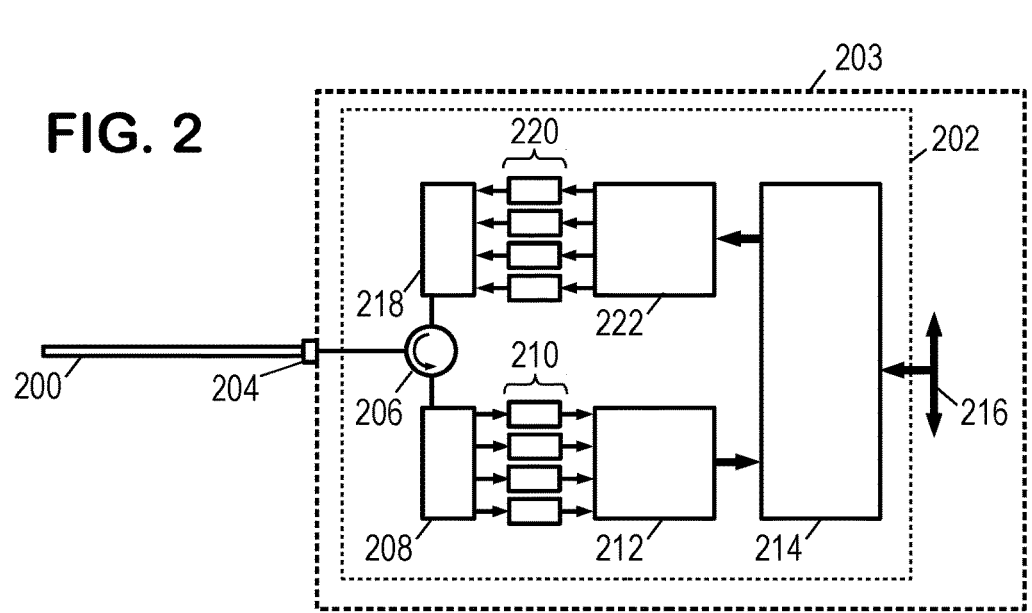
FIG. 2 is a function-block diagram of an illustrative transceiver.

FIG. 2 shows one such optical fiber 200 coupled to an illustrative transceiver 202 in a terminal node 203. (Each optical fiber in a bundle may be coupled to a different transceiver in the terminal node.) An optical connector 204 couples the fiber 200 to an optical circulator 206. The circulator 206 forwards incoming light signals to a channel splitter 208, which separates the various channels and provides one to each detector 210. The multiple detectors 210 each convert one of the light signals into an electrical receive signal. An integrated multi-channel receiver 212 operates on the electrical receive signals to extract the corresponding streams of digital data. An interface module 214 buffers the streams of digital data and converts them to a suitable format for communications of the terminal node's internal bus 216, in accordance with a standard I/O bus protocol. In some embodiments, the conversion performed by the interface module includes error correction and payload extraction.

From the internal bus 216, the interface module 214 also accepts digital data for transmission. In at least some embodiments, the interface module 214 packetizes the data with appropriate headers and end-of-frame markers, optionally adding a layer of error correction coding and/or a checksum. A multichannel transmitter 222 accepts the transmit data streams from interface module 214 and converts the digital signals into analog electrical drive signals for emitters 220, causing the emitters to generate optical signals that are coupled to a channel coupler 218. The channel coupler 218 provides them as a combined optical signal to the circulator 206, which forwards it as an outgoing signal to optical fiber 200.

Light signal modulation can be performed at extremely high symbol rates, necessitating that the receiver digitize the electrical receive signals at correspondingly high sampling rates, without sacrificing the precision required for maintaining an adequate signal-to-noise ratio.

Figure 3:
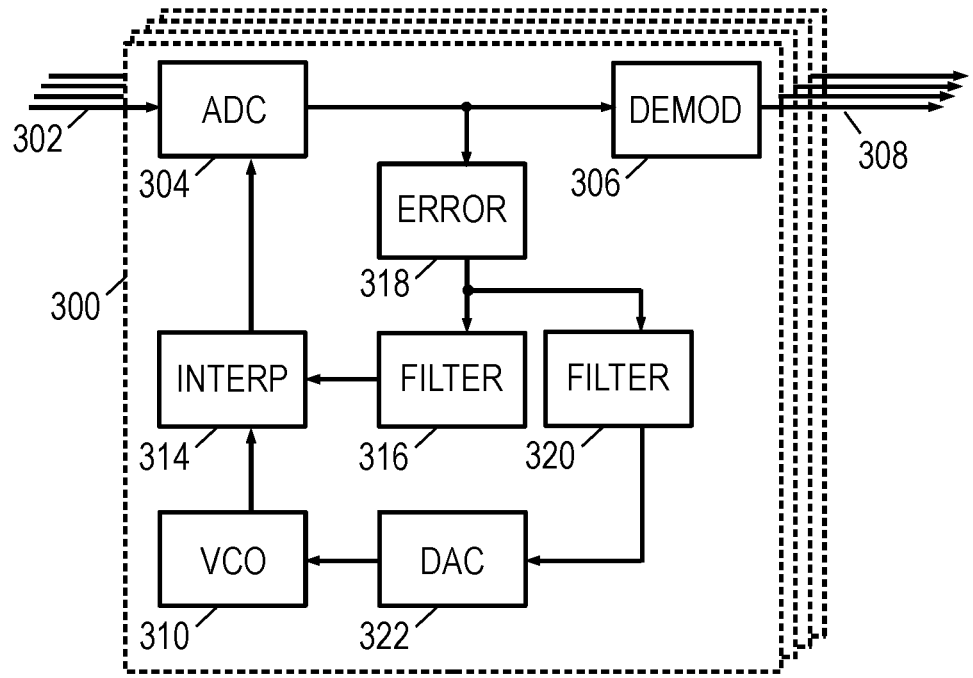
FIG. 3 is a function-block diagram of an integrated multi-channel receiver with potentially independent clock recovery modules.

FIG. 3 shows one "clock and data recovery" technique implemented by an illustrative integrated multichannel receiver 212. The receiver 212 includes an individual receive module 300 for each of the electrical receive signals 302. Within each receive module 300, an analog-to-digital converter 304 samples the analog receive signal 302 at sample times corresponding to transitions in a clock signal, thereby providing a digital receive signal to a demodulator 306. The demodulator 306 applies equalization and symbol detection using, e.g., a matched filter, a decision feedback equalizer, a maximum likelihood sequence estimator, or any other suitable demodulation technique. The resulting stream of demodulated symbols 308 may be supplied to the interface module 214.

To derive a suitable clock signal for sampling, the receive module 300 employs a clock recovery module which includes a voltage controlled oscillator (VCO) 310, a phase interpolator 314, a phase control filter 316, a timing error estimator 318, a frequency control filter 320, and a digital to analog converter (DAC) 322. VCO 310 receives a control signal from DAC 322 and responsively generates an oscillating signal (from which a clock signal can be derived) with a frequency corresponding to the voltage of the control signal. Due to feedback, the oscillating signal frequency closely approximates the nominal symbol frequency of the receive signal 302. Nevertheless, at least some drift of the sampling phase and frequency is expected.

A phase interpolator 314 converts the clock signal to a suitable sampling signal for analog-to-digital converter 304, correcting for phase offsets. Phase control filter 316 provides the appropriate phase correction signal to the interpolator 314. To determine the appropriate phase correction, the phase control filter operates on a sequence of timing error estimates received from timing error estimator 318.

Timing error estimator 318 may operate using any of the suitable timing error estimation techniques disclosed in the open literature. Such techniques may first determine an amplitude error for each sample, e.g., by comparing the sample to an ideal amplitude (perhaps the amplitude of an uncorrupted symbol), or by determining a difference between the sample and the nearest decision threshold and subtracting that difference from the symbol margin. In some embodiments, the amplitude error is then correlated with the signal slope to obtain the timing error. In other embodiments, the amplitude error is correlated with the preceding symbol value or polarity to estimate the timing error. Still other embodiments employ oversampling and correlate the amplitude error with neighboring samples or differences between such neighboring samples to estimate the timing error.

Regardless of how it is obtained, the error estimate is preferably an unbiased estimate of timing error, but may alternatively be a binary sequence indicating whether the sample was acquired early (before the ideal sampling time) or late (after the ideal sampling time). From the timing error signal, the phase control filter 316 estimates the clock signal's phase error to determine at any given instant the phase adjustment that the phase interpolator 314 should apply to compensate. Separately from the phase control filter 316, a frequency control filter 320 operates on the timing error estimates to produce a frequency control signal. DAC 322 converts the frequency control signal from digital form to an analog frequency control signal having its value represented as a voltage. In some embodiments, the digital to analog converter provides 10-bit resolution. In other embodiments, the digital-to-analog converter is followed by a low-pass analog filter that filters the analog frequency control signal before it is applied to the VCO.

The VCO 310 produces an oscillating signal having a frequency corresponding to the value of the analog frequency control signal. This oscillating signal is converted into a digital clock signal that is supplied to the phase interpolator 314. The frequency control filter 320 operates to minimize any frequency offset between the clock signal and the digital receive signal, which indirectly minimizes any frequency offset between the sampling signal and the digital receive signal.

In at least some embodiments, the frequency control filter 320 is a filter with a recursive component. The phase control filter 316 may be a moving average filter or it too may include a recursive component. In at least some contemplated embodiments, the time constant of the frequency control filter is greater than eight times the time constant of the phase control filter.

The integrated multi-channel receiver design of FIG. 3 employs multiple oscillators on a shared substrate. Integrated transceiver designs (having a transmitter and receiver on the same substrate) may also call for the use of multiple oscillators. At high frequencies the multiple oscillators may tend to exhibit coupling effects, potentially introducing a reduced frequency stability known as "pulling". While such coupling effects can be minimized with careful circuit design, e.g., positioning traces with sufficient separation or suitable geometries to minimize or compensate for inductor and capacitive coupling, it is desirable to reduce the number of active oscillators whenever possible, e.g., by enabling multiple receivers, multiple transmitters, or transmitters and receivers, to employ a shared oscillator. Such sharing is feasible when frequency locking exists or can be implemented between multiple channels, or between the transmit and receive streams on a given channel. Generally speaking, such frequency locking may be expected between adjacent channels.

As a brief aside, it is noted here that in some respects, the described VCO usage is atypical. The most common application of VCOs is believed to be for phase lock loops (PLLs) such as those employed for frequency multiplication. The subsequent teachings remain applicable to all such contexts.

Figure 4:
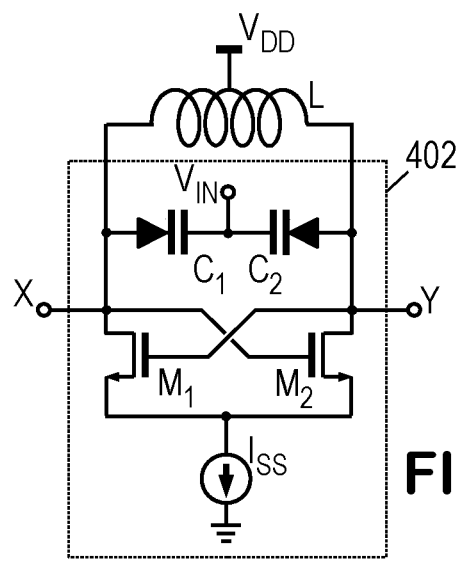
FIG. 4 is a circuit diagram of an illustrative voltage-controlled oscillator.

An illustrative VCO circuit schematic is shown in FIG. 4 to illustrate the potential use of a loop inductor by an oscillator drive core 402. Many other suitable VCO circuits are available in the open literature and can alternatively be employed. When power is first applied, the transistors M1, M2 are both off and currents begin flowing through the halves of inductor L to charge the capacitors (varactors) C1, C2 relative to the control signal voltage ($V_{IN}$), raising the voltage at nodes X, Y. One of the nodes, say node Y, charges slightly faster, causing transistor M1 to conduct while transistor M2 is still off. Current source $I_{SS}$ reduces the voltage at node X, momentarily "latching" the transistors in their state. Due to the inductor current, the node Y voltage continues to increase charging capacitor C2 beyond the supply voltage $V_{DD}$ until the inductor current is suppressed and begins flowing in the opposite direction, pulling the node Y voltage down to a level that causes transistor M1 to turn off and, because the inductor current flow exceeds $I_{SS}$, raises the voltage at node X, causing transistor M2 to turn on. Thereafter, the inductor current and capacitor charges oscillate at a frequency determined by the inductor's inductance and the varactor's capacitance.

The transistors M1, M2 enable the current source $I_{SS}$ to "boost" the inductor currents at the right moments to sustain the oscillation. If the voltages from nodes X,Y are supplied to a differential amplifier, a digital clock signal is produced at the resonance frequency. Capacitors C1, C2 may be voltage-controlled capacitors, enabling the resonance frequency to be controlled by a bias voltage on the capacitors.

The contemplated VCOs on the monolithic semiconductor substrate each include a center-tapped inductor coil as part of a resonant circuit. The primary contributor to coupling between such oscillators is magnetic coupling between the inductors of one oscillator and the inductors of its neighbors. To minimize unwanted inductive coupling effects, alternative loop inductor designs may be used.

FIGS. 5A-5C present three illustrative loop inductor designs. At the frequency range of interest, the desired inductance value can be achieved with a conductive trace on a insulated substrate. FIG. 5A shows a one-loop ("Type-0") design, with the trace between terminals A,B enclosing a single region. Terminals A,B may be coupled to nodes X,Y in the circuit of FIG. 4, while the supply voltage is coupled to a center tap at C. (Again, other oscillator designs are contemplated, which may involve connecting the inductor in a different fashion. The single-loop design forms a single magnetic dipole represented by the magnetic field H. This single dipole is susceptible to near-field coupling and radio frequency interference with other components.

FIG. 5B shows a two-loop ("Type-8") design intended to reduce such coupling and interference. The trace between terminals A,B includes a crossover X, in which vias route one of the edges to another trace layer for a distance sufficient to permit the other edge to cross over without shorting to the first edge. As the electrical characteristics of the vias and each trace layer may be different, the crossover introduces a slight imbalance relative to the center tap C, potentially coupling noise from the power source into the oscillation signal. Nevertheless, the crossover enables the trace to enclose two regions of similar size and shape with currents flowing in an opposite sense, thereby forming opposing magnetic dipoles as represented by the magnetic fields H1, H2. At a distance, these opposing dipoles effectively cancel out, yet at closer spacings a degree of near-field coupling remains. In particular, the circuit designer must guard against any arrangements having unequal spacing between the loops of different inductors. For example, a side-by-side arrangement is to be preferred over an end-to-end arrangement.

FIG. 5C shows a three-loop design which further reduces near field coupling and relaxes the layout restrictions on nearby inductors. In this design, the trace between terminals A,B includes two crossovers X1, X2. As there are two, the electrical characteristic deviations can now be balanced relative to the center tap C. With the two crossovers, the trace encloses a central region and encloses two side regions with a current flow in an opposite sense relative to the center region. The center region forms a magnetic dipole H1, while the side regions form two opposing magnetic dipoles H2, H3. Each of the side regions has about half the area of the central region, so that the opposing dipoles H2, H3 are half the strength of the center dipole H1 and the three dipoles cancel out at a distance.

FIG. 6 is a graph showing, as a function of frequency, the simulated mutual coupling between one-loop inductors spaced 477 um apart (curve 602). Also shown is the simulated coupling between three-loop inductors having the same inductance value and center-to-center spacing (curve 604). When the inductors are spaced apart along their long axis, the three-loop inductor design offers an isolation improvement greater than 23 dB (about 10 dB better than that of the two-loop design). Note that the designs of FIGS. 5A-5C are designs having one winding or "turn", but they nevertheless illustrate principles that are also applicable to multi-turn designs.

Figure 7:
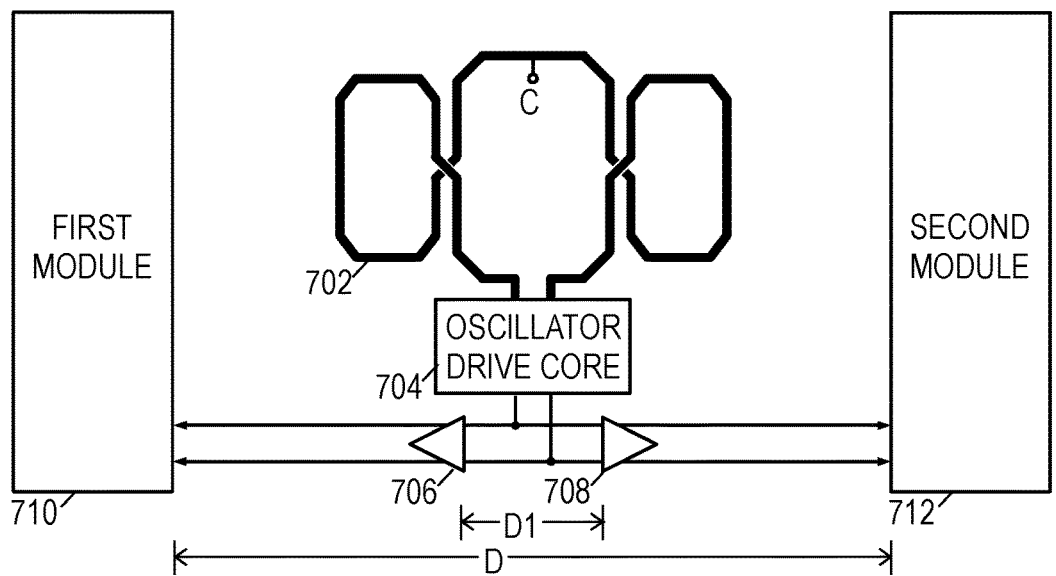
FIG. 7 is a first schematic of two circuit modules with an illustrative shared oscillator.

In addition to using a multi-loop design to reduce coupling, the integrated circuit may reduce the number of oscillators on the substrate to increase spacing, e.g., by enabling multiple modules to use shared oscillators. FIG. 7 demonstrates one oscillator sharing approach. The shared oscillator includes a loop inductor 702 coupled to an oscillator drive core 704 to produce an oscillating signal. One or more differential amplifiers 706, 708 convert the oscillating signal into a digital clock signal which is supplied to a first circuit module 710 and a second circuit module 712. The circuit modules may be, e.g., transmit modules, receive modules, transceiver modules, or any module operating from a high frequency clock. FIG. 7 shows the distance between the modules 710, 712 as D, and the distance between the differential amplifiers 706, 708 as D1. Hence the distance that must be traversed by the digital clock signals is D-D1, also called the "driving distance".

At the high clock signal frequencies in question (greater than 2 GHz), the power required to convey them is a strong function of the driving distance. A significant power savings can be achieved by reducing the driving distance. In the configuration of FIG. 7, the driving distance is based on distance D1, which is limited by the required oscillating signal strength at the input terminals of the differential amplifiers.

Figure 8:
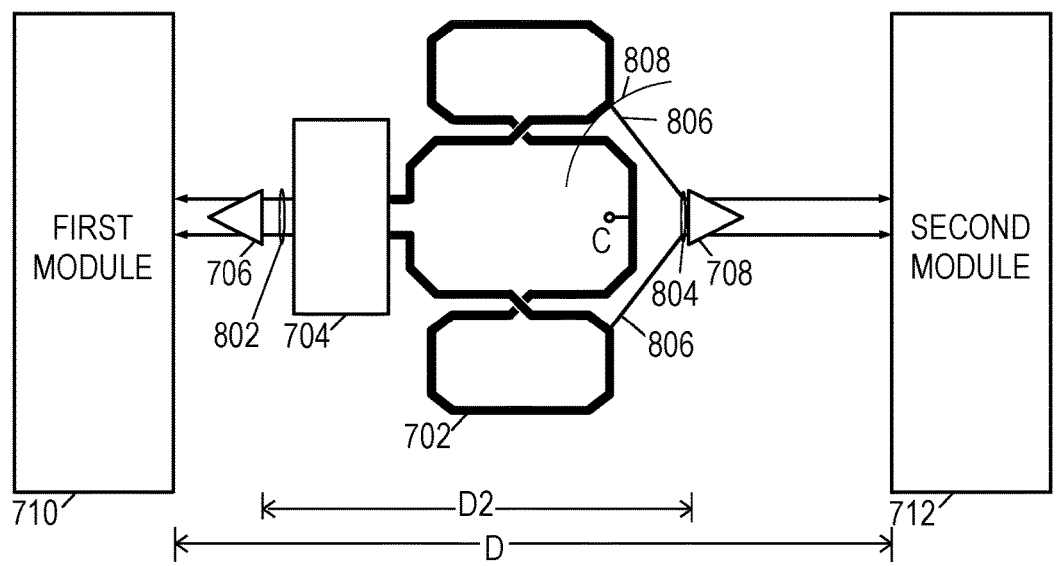
FIG. 8 is a second schematic of two circuit modules with an illustrative shared oscillator having a multiport inductor.

However, the inductor dimensions are relatively large, and the addition of a second port to the inductor, as shown in FIG. 8, enables a significant reduction in the driving distance to be achieved. Relative to FIG. 7, the oscillator is rotated to place the inductor terminals (hereafter termed the drive port 802) on the side of the oscillator nearest the first circuit module 710. For measurement purposes, the input terminals of the differential amplifier 706 will be treated as the terminals of the drive port 802.

To minimize the driving distance, the second differential amplifier 708 is positioned on the side of the oscillator nearest the second circuit module 712. The input terminals of differential amplifier 708 will be treated as the terminals of a second port on the inductor, hereafter termed the sense port. Taps 806 connect the sense port terminals to the inductor 702. Ideally, each tap 806 connects to the inductor at a point nearest a respective terminal of the sense port, thus minimizing the length of routing conductor between the tap and the terminal, which is desirable to minimize the parasitic effect on behavior of the inductor structure. Moreover, the taps are preferably connected symmetrically relative to the center tap C to minimize common mode signal noise from e.g., supply voltage variation.

However, if the taps are connected too near to the center tap C, the inductor current flow fails to provide a sufficient voltage swing between the taps. (In some embodiments, the amplitude of the oscillating signal at the sense port should be at least 50% of the amplitude at the drive port.) Accordingly, arcs of increasing radii 808 may be drawn around each sense port terminal to determine the nearest point on the inductor's outer perimeter which provides a sufficient voltage swing. The three loop inductor design provides potentially advantageous tap connection points on its side loops from which approximately 75% of the voltage swing can be sensed with relatively short routing conductors.

With the use of two inductor ports, the differential amplifiers can be positioned with a wider spacing D2, significantly reducing their distance from their respective modules 710, 712. The driving distance D-D2 is significant reduced, with a consequent power savings.

Figure 9A:
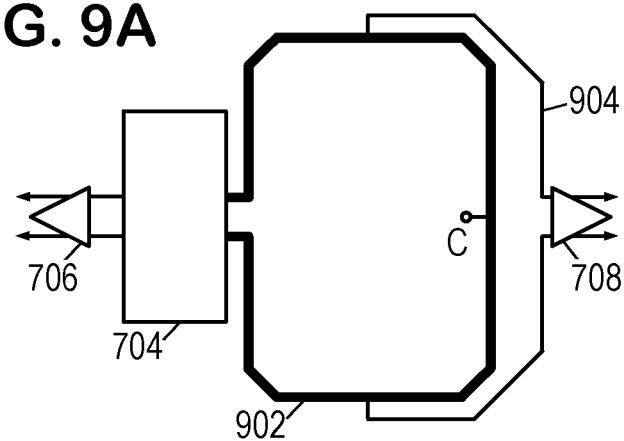
FIGS. 9A-9C are schematics of various multiport inductor configurations.

This potential advantage of the three loop inductor design may be better appreciated by comparison with other loop inductor designs. FIG. 9A shows a single loop inductor 902 where the taps must be placed at least halfway around the inductor's perimeter to achieve a 50% voltage swing. The sense port routing conductors 904 must necessarily bend around the inductor loop, increasing their length and parasitic effect to an extent that would likely require the original inductor design to be modified to accommodate the parasitic effects.

Figure 9B:
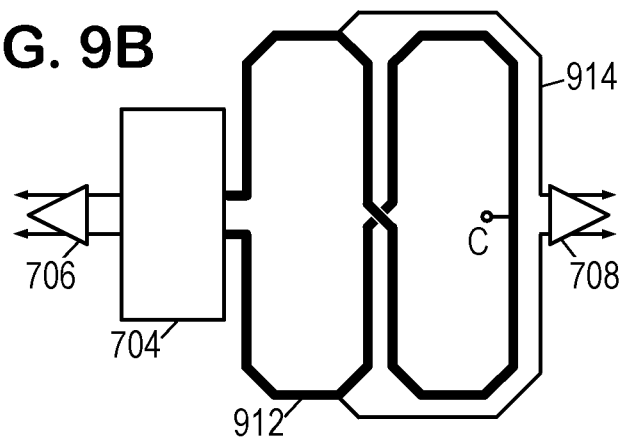

Similarly, with the two-loop inductor 912 of FIG. 9B, a 50% voltage swing would require the taps to be positioned at least halfway around the outer perimeter, necessitating routing conductors 914 of a length and parasitic effect that would likely force a redesign of the original inductor. In contrast, the three-loop inductor of FIG. 8 enables the use of significantly shorter routing conductors.

Figure 9C:
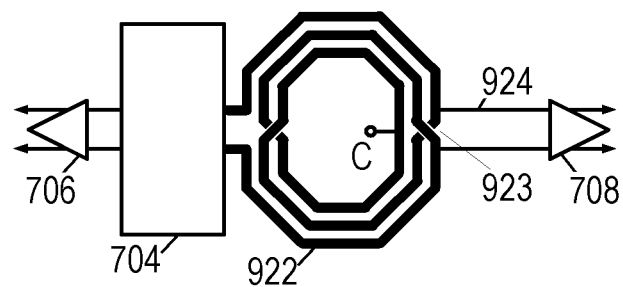

The foregoing discussion has focused on single-winding loop conductors, as single-winding designs are generally preferred for the frequency range of interest. However, multi-turn (aka multi-winding) loop conductors are also known and can be employed. Multi-turn designs exist for single-loop, two-loop and three-loop (and higher) inductors. For example, FIG. 9C shows an illustrative three-turn single-loop inductor 922.

As previously mentioned, inductor designs are preferably symmetric so as to minimize common mode noise. Such symmetry considerations often cause multi-turn inductor designs to incorporate a crossover 923 on the inductor's outer perimeter, diametrically opposite from the drive port. If N is the number of turns (windings) in the inductor, the voltage swing at the crossover can be expected to be approximately (N−1)/N, or greater than 50% for multi-turn designs. Thus the sense port taps can be connected to either side of the crossover, minimizing the length of the routing conductors 924.

Numerous alternative forms, equivalents, and modifications will become apparent to those skilled in the art once the above disclosure is fully appreciated. The disclosed multi-port inductors may be employed not only in VCOs and other forms of oscillators, but in any circuit where it is desirable to distribute an inductor-based signal in opposite directions. It is intended that the claims be interpreted to embrace all such alternative forms, equivalents, and modifications that are encompassed in the scope of the appended claims.

What is claimed is:

1. An integrated circuit comprising:
   a substrate; and
   an inductor having:
      multiple loops on said substrate, each loop defining a corresponding dipole, said dipoles summing to zero with two side loop dipoles being equal and arranged symmetrically relative to a center loop dipole;
      a drive port on an outer perimeter of the inductor; and
      a sense port connected to taps on the outer perimeter, the sense port positioned diametrically opposite the drive port.

2. The circuit of claim 1, wherein the drive port also serves as an output port.

3. The circuit of claim 2, further comprising an oscillator drive core coupled to the drive port to produce oscillating signals from the drive port and the sense port.

4. The circuit of claim 3, wherein the oscillator drive core adjusts a frequency of the oscillating signals in response to a control signal.

5. The circuit of claim 1, wherein the inductor includes multiple windings for each loop.

6. The circuit of claim 5, wherein the inductor further includes a crossover on the outer perimeter closest to the sense port, and wherein the taps are connected on either side of the crossover.

7. The circuit of claim 1, wherein the inductor is a single-winding, three-loop inductor.

8. The circuit of claim 7, wherein a first of the sense port taps connects to the outer perimeter of a first of the two side loops at a point closest to a terminal of the sense port, and wherein a second of the sense port taps connects to the outer perimeter of a second of the two side loops at a point closest to a corresponding terminal of the sense port.

9. The circuit of claim 1, wherein the inductor has only one winding, and wherein each tap connects to the outer perimeter at a point closest to a terminal of the sense terminal subject to obtaining a sense port signal amplitude at least 50% of a drive port signal amplitude.

10. An electrical circuit manufactured on a substrate, the electrical circuit comprising:
  at least two modules; and
  a shared oscillator including:
    an inductor having a drive port and a sense port, the inductor being a three-loop inductor with a center loop and two side loops, the two side loops having associated dipoles that combine to substantially cancel a dipole associated with the center loop; and
    a drive core coupled to the drive port to produce oscillating signals from the drive port and the sense port,
  wherein a first of the at least two modules receives a clock derived from the drive port's oscillating signal via a first trace, and a second of the at least two modules receives a clock derived from the sense port's oscillating signal via a second trace,
  wherein the first and second traces, along with any inline buffers, have a combined length less than a shortest distance between the two modules.

11. The circuit of claim 10, wherein the first and second modules each include a communications transmitter or a communications receiver.

12. The circuit of claim 10, wherein the first and second modules are positioned on opposite sides of the shared oscillator.

13. The circuit of claim 10, wherein the drive core adjusts a frequency of the oscillating signals in response to a control signal.

14. The circuit of claim 10, wherein the inductor includes multiple windings for each loop, wherein the inductor further includes a crossover on the outer perimeter closest to the sense port, and wherein terminals for the sense port are connected on either side of the crossover.

15. The circuit of claim 10, wherein the inductor is a single-winding inductor.

16. The circuit of claim 15, wherein terminals for the sense port each connect to an outer perimeter of a corresponding one of the two side loops at a point closest to a respective terminal of the sense port.

17. A method for manufacturing an integrated circuit with a shared on-chip oscillator, the method comprising:
  providing an inductor having:
    a center loop and two side loops on a substrate, the two side loops having associated dipoles that combine to substantially cancel a dipole associated with the center loop;
    a drive port on an outer perimeter of the inductor; and
    a sense port connected to taps on the outer perimeter, the sense port positioned diametrically opposite the drive port;
  coupling a drive core to the drive port to produce oscillating signals from the drive port and the sense port;
  providing a first trace to convey a clock derived from the drive port's oscillating signal to a first circuit module on one side of the inductor; and
  providing a second trace to convey a clock derived from the sense port's oscillating signal to a second circuit module on an opposite side of the inductor, wherein the first and second traces have a combined length that is less than a shortest distance between the first and second circuit modules.

18. The method of claim 17, further comprising providing a trace to supply a control signal to the drive core to adjust a frequency of the oscillating signals.

19. The method of claim 17, wherein the inductor includes multiple windings for each loop, wherein the inductor further includes a crossover on the outer perimeter closest to the sense port, and wherein each terminal of the sensor port connects to an opposite side of the crossover from the other terminal of the sense port.

20. The method of claim 17, wherein each terminal of the sense port connects to the outer perimeter of a corresponding side loop at a point closest to a respective terminal of the sense port.

* * * * *